United States Patent [19]

Giles et al.

[11] 4,031,414

[45] June 21, 1977

[54] CIRCUIT ARRANGEMENT FOR PRODUCING HIGH CURRENT PULSES

[75] Inventors: Thomas Clyde Giles, Downers Grove; Otto James Kohout, Addison; Gerald Michael Rinaldi, Mundelein, all of Ill.

[73] Assignee: GTE Automatic Electric Laboratories Incorporated, Northlake, Ill.

[22] Filed: June 10, 1976

[21] Appl. No.: 694,751

[52] U.S. Cl. .............................. 307/270; 307/254; 307/263; 307/237
[51] Int. Cl.[2] ........................................ H03K 17/00
[58] Field of Search .......... 307/270, 254, 263, 293, 307/237; 328/67

[56] References Cited

UNITED STATES PATENTS

| 3,564,297 | 2/1971 | Elsner | 307/263 |
| 3,754,274 | 8/1973 | Auger | 307/270 |
| 3,922,570 | 11/1975 | Eguchi et al. | 307/270 |

Primary Examiner—Stanley D. Miller, Jr.
Assistant Examiner—B. P. Davis
Attorney, Agent, or Firm—Donald J. Lenkszus

[57] ABSTRACT

A circuit arrangement for producing high current pulses includes a first constant current source for generating current pulses connected to a charged capacitor arranged so that the effective operating voltage of the constant current source is increased and a voltage limiting circuit that serves to limit the voltage potential impressed across the first constant current source. During the interval between current pulses, the voltage limiting circuit isolates the capacitor from the load and a series path is established which includes a second constant current source for charging the capacitor at a controlled rate.

8 Claims, 1 Drawing Figure

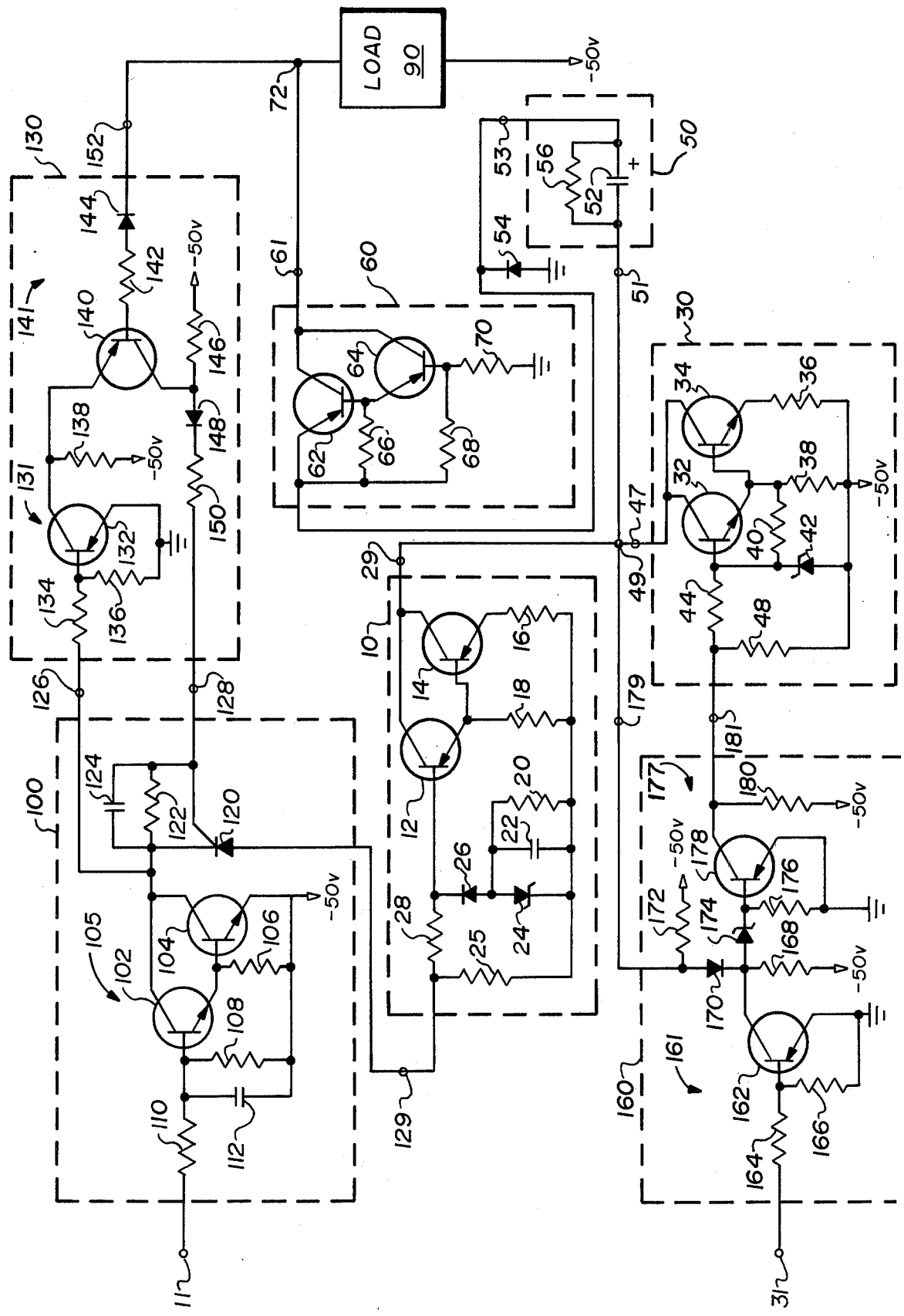

CIRCUIT ARRANGEMENT FOR PRODUCING HIGH CURRENT PULSES

BACKGROUND OF THE INVENTION

1. Field of the Invention

This invention relates to pulse generators and more particularly to an improved pulse generator for supplying high current pulses.

2. Description of the Prior Art

Such pulse generators are especially needed in telephone switching networks of the types employing magnetic latching reed relays as crosspoints. In these types of networks, control windings of the magnetic latching reed relays are arranged in a matrix array. A selected relay is operated by applying a current pulse to a corresponding path through the matrix arrangement.

One problem that has been encountered is to supply relatively high current pulses from a pulse generator operating from a telephone central office power source. This problem may be understood by the following illustrative example. Certain reed relays require operate current pulses of approximately 5.8 amperes; the impedance presented by control paths through a matrix arrangement of control windings is 12 ohms; and the central office power source is nominally −50 volts.

Certain prior art pulse generator circuits operating from −50 volts are such that only a 4 ampere current pulse can be supplied to a 12 ohm load. Other pulse generator circuit arrangements for supplying higher current pulses have been suggested, for example, as shown in U.S. Pat. No. 3,564,297 issued to P. Elsner. However, these circuit arrangements employ relatively expensive transformers or inductors to increase the effective operating voltage of the pulse generator.

SUMMARY OF THE INVENTION

The present invention is directed to a reliable and relatively inexpensive pulse generator which is particularly adapted to rapid rise, short-duration current pulse generation and more particularly adapted to telephone switching networks and the like where current pulses of a high magnitude are required and only a single power source of nominal voltage is available.

In accordance with the principles of this invention, current pulses to be supplied to a load are generated by a pulse generator including a selectively operable first constant current source serially connected with a charged capacitor. The capacitor is connected to the first constant current source such that the effective operating voltage of the pulse generator is increased. A voltage limiting means connected in series with the charged capacitor serves to limit the voltage across the first constant current source.

Also, in accordance with the principles of this invention, a second selectively operable constant current source and a diode serve to charge the capacitor at a predetermined rate to a predetermined voltage when the first constant current source is not operated. A threshold circuit means operates to prevent the occurrence of substantial current surges at high voltages across the second constant current source when power is applied to the pulser circuit after a relatively long period of having no power.

Further, in accordance with the principles of this invention, a continuity testing means is provided for detecting if a load is connected to the pulse generator and for inhibiting the generation of current pulses by the first current source if a load is not present.

DESCRIPTION OF THE DRAWING

The invention may be best understood by reference to the following description taken in conjunction with the accompanying drawing in which the single FIGURE shows in schematic form an illustrative embodiment of the invention.

DESCRIPTION OF THE PREFERRED EMBODIMENT

With reference to the embodiment of the invention illustrated in the FIGURE, current pulses are to be supplied to a load 90 which is connected to the terminal 72 and to a power source. The load 90 typically comprises a selected path through a matrix arrangement of control windings of magnetic latching reed switches employed as crosspoints in a telephone switching network. A source of control signals which is not shown is connected to the input terminals 11 and 31. A triggering means shown generally at 100 has a first input connected to input terminal 11, a first output connected via the line 129 to an enable input of a first current source means 10, a second input connected via the line 128 to continuity testing means 130, and a second output connected via the line 126 to the continuity testing means 130. The continuity testing means 130 has an input connected via the line 152 to terminal 72. The triggering means 100 includes a current limiting resistor 110 and bypass capacitor 112 connected to a transistor switch shown generally at 105 and comprising transistors 102 and 104 and biasing resistors 106 and 108. The collectors of the transistors 102 and 104 are connected to the line 126 and to a latching means shown generally at 121 including SCR (Silicon Controlled Rectifier) 120, a desensitizing resistor 122 and a capacitor 124 for rate effect suppression connected between the cathode and gate of the SCR 120. The continuity testing means 130 includes a transistor switch shown generally at 131 connected to the line 126 that includes a transistor 132 and biasing resistors 134, 136 and 138. The collector of transistor 132 is connected to a first switch means shown generally at 141 including a transistor 140 having its base connected via resistor 142 and diode 144 to the line 152 and having its collector connected to a pullup resistor 146 and the series combination of a diode 148 and a current limiting resistor 150 connected to the line 128.

In the absence of a pulse control signal at terminal 11 the transistor switch 105 is turned off thereby causing the latching means 121 to be turned off or in a reset state so that the first current source means 10 is turned off and so that the transistor switch 131 is turned off thereby inhibiting the operation of the continuity testing means 130. When a pulse control signal is applied to terminal 11 the transistor switch 105 is turned on thereby turning on the transistor switch 131 of the continuity testing means which in turn results in the voltage potential at the emitter of the transistor 140 to be near ground. If a load is connected to the terminal 72 a current will flow via line 152, diode 144 and resistor 142 into the base of the transistor 140 thereby turning on the transistor 140. Consequently, the voltage continuity testing means 130 applies via the line 128 a voltage potential near ground voltage to the gate of the SCR causing the SCR 120 to turn on. With SCR 120 turned on, an enable signal is applied via line 129 to the control input of the first constant current source 10. The enable signal will have a duration substantially equal to that of the pulse control signal. If a load is not connected to the terminal 72, the first switch means 141 will remain turned off thereby maintaining the SCR 120 turned off and effectively inhibiting the generation of an enable signal by the triggering means 100. The latching means 121 is provided since the presence of the load may be masked by a current pulse produced by the first constant current source 10.

The first current source means 10 is a constant current source of a type well known in the art, having an enable input and a constant current output. The first current source means 10 includes the transistor 12 and 14 connected in a Darlington arrangement and a biasing network including resistors 16, 18, 20, 25 and 28, a capacitor 22, a diode 26, and a zener diode 24. The first current source 10 is connected via the line 29 to the point 49 and thence via the line 51 to capacitor means 50. The capacitor means 50 includes the parallel combination of a capacitor 52 and a bleeder resistor 56 connected via the line 53 to voltage limiting means 60 and a current path means or diode 54. The voltage limiting means 60 is connected via the line 61 to the terminal 72 and includes a pair of transistors 62 and 64 arranged in a Darlington configuration and biasing resistors 66, 68, 70 which collectively operate as an emitter follower circuit of the type well known in the art.

A threshold circuit means 160 has a first input connected to the terminal 31, a second input connected via the line 179 to point 49 and thence via the line 51 to the capacitor means 50, and an output connected via the line 181 to an enable input of a second current source 30. The threshold circuit means 160 includes a transistor switch shown generally at 161 connected to the input terminal 31 and including a transistor 162 and biasing resistors 168, 166 and 164. The output of the transistor switch 161 is connected to the anode of zener diode 174 and the cathode of diode 170. The anode of diode 170 is connected to resistor 172 and to line 179. The cathode of zener diode 174 is connected to the input of a transistor switch shown generally at 177 and including transistor 178 and biasing resistors 176 and 180.

The second constant current source 30 has an output connected via the line 47 to point 49 and thence via line 51 to the capacitor means 50. The second constant current source 30 is of a type well known in the art and includes transistors 32 and 34 and a biasing network including resistors 36, 38, 40, 44 and 48 and zener diode 42.

The threshold circuit means 160 operates to prevent the occurrence of substantial current surges at high voltages at transistors 32 and 34 when power is applied to the pulser circuit after a relatively long period of having no power. When power is initially applied, the transistor switch 177 is maintained in a turned off condition until the voltage across the capacitor 52 reaches a predetermined magnitude, e.g., 27 volts, as determined by the zener diode 174. During this time the capacitor charges at a relatively slow rate, e.g., 11 volts per second, through the resistors 168 and 172. When the voltage across the capacitor 52 reaches the predetermined magnitude, the transistor switch 177 will turn on thereby enabling the second constant current source, provided that a recharge command signal has been applied to the terminal 31 to turn off the transistor switch 161. When the second constant current source 30 is enabled the capacitor 52 is charged at a faster rate, e.g., 6 volts per millisecond, as determined by the second constant current source 30. If a recharge command signal has not been applied to the terminal 31, the transistor switch 161 will be turned on thereby inhibiting the transistor switch 177 which in turn inhibits the second constant current source 30 and the capacitor 52 will continue to charge at the relatively slow rate until it is fully charged to approximately the power supply voltage.

In operation, either the first constant current source 10 is enabled or the second constant current source 30 is enabled. If the second constant current source 30 is enabled and the first constant current soruce 10 is not enabled, a series path is established for charging the capacitor 52 to substantially the magnitude of the power source voltage. The series path includes the second constant current source 30, the capacitor 52 and the diode 54. A constant current flows through the diode 54 and the capacitor 52 into the second constant current source 30 until the capacitor 52 is within a few volts of being charged to the magnitude of the power source voltage, i.e., 50 volts. When this occurs, the transistors 32 and 34 go into saturation and the current flow is substantially controlled by the resistor 36 until it decreases to zero. The capacitor 52 is thus charged so that it obtains a polarity as indicated by the + symbol. During the period of time that the capacitor 52 is being charged, the diode 54 is forward biased and the voltage limiting means 60 is thereby maintained in a turned off state. Thus, the voltage limiting means 60 isolates the capacitor 50 from the load 90.

If the enable signal is removed from the input of the second constant current source 30 and an enable signal is now applied to the input of the first constant current source 10, a series pulsing path is established which includes the first constant current source 10, the capacitor means 50 and the voltage limiting means 60. The series path is completed through the load 90 to the −50 volt power source. Since the capacitor 52 is charged to approximately the power supply voltage, the effective operating voltage of the second constant current source 10 is approximately twice that of the power supply voltage. The duration of the current pulse generated by the first constant current source 10 is determined by the duration of the enable signal. The voltage limiting means serves to limit the voltage across the first constant current source 10 to prevent secondary breakdown from occurring in the transistors 12 and 14. If, for example, the load 90 is capacitive, the voltage across the load will increase in magnitude initially from 0 volts to approximately twice the power supply voltage, i.e., the power supply voltage plus the voltage of charged capacitor 52. The voltage limiting means 60 operates as an emitter follower with the collector to emitter voltage, VCE, of the transistor 62 decreasing in magnitude as the magnitude of the voltage across the load increases so that the line 53 is maintained at essentially ground potential until the magnitude of the voltage across the load reaches 50 volts. During this time the magnitude of the voltage across the first constant current source 10 is limited to 50 volts. As the voltage across the load 90 increases beyond 50 volts, the magnitude of VCE will be approximately zero volts are and the magnitude of the voltage across the first constant current source 10 will decrease. Thus, the voltage impressed across the first constant current source 10 is limited to approximately the supply voltage thereby preventing secondary breakdown of the transistors 12 and 14.

The illustrative embodiment of the invention is powered from a −50 volt source and provides 5.8 ampere current pulses having 29 ampere per millisecond rise times into a 12 ohm load. Thus, although the illustrative embodiment operates from a single power supply of nominal voltage, it is possible to obtain current pulses significantly greater than that which might otherwise be obtained.

The principles of this invention may be applied to arrangements for providing even higher currents or driving even larger impedance loads by, for example, connecting additional series combinations of a capacitor means 50, diode 54, and voltage limiting means 60 between the first constant current source 10 and the load 90 and providing a source of recharge current for each capacitor means 50. Since these and other arrangements will occur to those skilled in the art without departure from the spirit and scope of the invention, it is intended that all matter set forth in the above description or shown in the drawing shall be interpreted as illustrative and not in any limiting sense.

What is claimed is:

1. A pulse generating circuit for supplying high current pulses to a load comprising:
    a first selectively controlled constant current source;
    capacitor means connected to said first constant current source;
    a second selectively controlled constant current source connected to said capacitor means for charging said capacitor means to a first predetermined voltage level;
    first means for establishing a first electrical path for charging said capacitor means when said second constant current source is operated;
    second means for limiting the voltage at the output of said first constant current source to a first predetermined value when said first constant current source is operated; and
    third means for isolating said load from said capacitor means when said second constant current source is operated.

2. A pulse generating circuit in accordance with claim 1 wherein said first means comprises a diode.

3. A pulse generating circuit in accordance with claim 1 comprising:
    threshold circuit means for inhibiting the operation of said second constant current source when said capacitor means is charged to less than a second predetermined voltage level.

4. A pulse generating circuit in accordance with claim 3 wherein said threshold circuit means includes:
    fourth means for charging said capacitor means at a second predetermined rate when said second constant current source is inhibited.

5. A pulse generating circuit in accordance with claim 3 wherein said threshold circuit means includes:
    a second diode connected to said capacitor means;
    a zener diode connected to said first diode; and
    a switch means connected to said zener diode and said second constant current source.

6. A pulse generating circuit in accordance with claim 3 comprising:
    means for detecting continuity through said load and for inhibiting the operation of said first constant current source when continuity is not detected.

7. A pulse generating circuit in accordance with claim 6 wherein said continuity detecting means includes a switch means connected to said load for detecting current flow through said load.

8. A pulse generating circuit in accordance with claim 6 further comprising latch means connected to said first current constant source; and
    said continuity detecting means including a switch means connected to said load and to said latch means, said switch means applying a first signal to said latch means in response to a flow of current through said load, said latch means enabling said first constant current source in response to the concurrent occurrence of said first signal and a control signal.

* * * * *